United States Patent
Meng et al.

(10) Patent No.: US 6,797,985 B1
(45) Date of Patent: Sep. 28, 2004

(54) ACTIVE MATRIX ORGANIC LIGHT-EMITTING DIODE AND MANUFACTURING METHOD THEREOF

(75) Inventors: Hsin-Fei Meng, Shindian (TW); Lai-Cheng Chen, Hsinchu (TW); Sheng-fu Horng, Hsinchu (TW); Lichi Lin, Chiai (TW)

(73) Assignee: Delta Optoelectronics, Inc., Hsinchu (TW)

( * ) Notice: Subject to any disclaimer, the term of this patent is extended or adjusted under 35 U.S.C. 154(b) by 0 days.

(21) Appl. No.: 10/635,328

(22) Filed: Aug. 5, 2003

(30) Foreign Application Priority Data

Apr. 24, 2003 (TW) .......................................... 92109576 A

(51) Int. Cl.[7] ...................... H01L 29/16; H01L 29/161; H01L 33/00; H01L 27/01; H01L 27/12
(52) U.S. Cl. ........................... 257/83; 257/84; 257/103; 257/350
(58) Field of Search ............................. 257/81, 83, 84, 257/103, 350

(56) References Cited

U.S. PATENT DOCUMENTS 6,310,362 B1 * 10/2001 Takemura .................... 257/59
2003/0222311 A1 * 12/2003 Kim ............................ 257/347

* cited by examiner

Primary Examiner—Ngân V. Ngô
(74) Attorney, Agent, or Firm—J.C. Patents

(57) ABSTRACT

An active matrix organic light-emitting diode and manufacturing method thereof is provided. A thin film transistor having a gate, a source and a drain is formed over a substrate. An anode layer is formed over the substrate such that the anode layer connects electrically with the source terminal of the thin film transistor. An organic layer is formed to cover the anode layer and the thin film transistor. The organic layer between the source and the drain serves as a channel region of the thin film transistor. A cathode layer is formed over the organic layer. Since the molecules inside the organic layer are aligned in a direction from the source to the drain and perpendicular to a direction from the anode layer to the cathode layer, electron mobility at the channel region is enhanced and the emitting efficiency of the diode is increased.

11 Claims, 2 Drawing Sheets

ACTIVE MATRIX ORGANIC LIGHT-EMITTING DIODE AND MANUFACTURING METHOD THEREOF

CROSS-REFERENCE TO RELATED APPLICATION

This application claims the priority benefit of Taiwan application serial no. 92109576, filed Apr. 24, 2003.

BACKGROUND OF THE INVENTION

1. Field of Invention

The present invention relates to an active matrix organic light-emitting diode (AMOLED) and manufacturing method thereof. More particularly, the present invention relates to an active matrix organic light-emitting diode having organic thin film transistors (OTFT) therein to serve as active devices and a method of manufacturing the same.

2. Description of Related Art

Organic light-emitting diode is a highly efficient semiconductor device for converting electrical energy into optical energy. The device finds applications in many areas serving, for example, as light indicators or the light-emitting elements in a display panel. Because of some very special properties of the organic light-emitting diode such as wide viewing angle, ease of manufacture, low production cost, quick response, wide operating temperature and full coloration, it has been widely adopted in multimedia systems.

At present, active matrix organic light-emitting diode is one of the most rapidly developed display products. An active matrix organic light-emitting diode is fabricated by sequentially forming an anode layer, an organic light-emitting layer and a cathode over a substrate with an array of thin film transistors thereon. In other words, the driving devices for the active matrix organic light-emitting diode are thin film transistors.

In general, the semiconductor layer (the channel layer) of the thin film transistors within an active matrix organic light-emitting diode is fabricated using silicon material. Typically, the semiconductor layer is formed in a molecular epitaxial process. However, the cost of the equipment for fabricating a silicon semiconductor layer is high and the production period is long. In addition, it is difficult to form inorganic thin film transistors on a plastic substrate (a flexible substrate) because inorganic silicon has poor plasticity (besides, the plastic substrate has low endurance for high temperature). Consequently, the scope of development for the organic light-emitting diode is somewhat restricted.

SUMMARY OF THE INVENTION

Accordingly, one object of the present invention is to provide an active matrix organic light-emitting diode and manufacturing method thereof capable of reducing production cost and cycle time and yet permitting a higher processing temperature.

A second object of this invention is to provide an active matrix organic light-emitting diode and manufacturing method thereof that can be fabricated on a plastic substrate with fewer processing steps.

To achieve these and other advantages and in accordance with the purpose of the invention, as embodied and broadly described herein, the invention provides an active matrix organic light-emitting diode. Each active organic light-emitting diode comprises a thin film transistor, an anode layer, an organic layer and a cathode layer. The thin film transistor is formed on a substrate. The thin film transistor furthermore comprises a gate, a source and a drain. The anode layer is positioned over the substrate. The anode layer and the source terminal of the thin film transistor are electrically connected. The organic layer is positioned over the substrate covering the thin film transistor and the anode layer. The organic layer is an organic semiconductor material layer with light emitting capacity. The organic layer between the source and the drain also serves as a channel region for the thin film transistor. The cathode layer is positioned over the organic layer, thereby forming an active organic light-emitting diode. The organic layer between the cathode layer and the anode layer constitutes a light-emitting region. In addition, the organic layer is fabricated using long chain organic polymer material such that the organic molecules are aligned in a direction parallel to the source-to-drain direction but perpendicular to the anode-to-cathode direction.

This invention also provides a method of fabricating an active matrix organic light-emitting diode. First, a thin film transistor is formed on a substrate. The thin film transistor has a gate, a source and a drain. Thereafter, an anode layer is formed over the substrate. The anode layer and the source terminal of the thin film transistor are electrically connected. An organic layer is formed over the substrate globally to cover the anode layer and the thin film transistor. The organic layer is a light-emitting organic semiconductor material layer and the organic layer in the area between the source and the drain serves as a channel region for the thin film transistor. A cathode layer is formed over the organic layer to produce an active organic light-emitting diode. The organic layer between the cathode layer and the anode layer constitutes a light-emitting region. In addition, the organic layer is fabricated using long chain organic polymer material such that the organic molecules are aligned in a direction parallel to the source-to-drain direction but perpendicular to the anode-to-cathode direction.

In this invention, the molecules within the organic layer are aligned along an axis parallel to the source-to-drain direction and perpendicular to the anode-to-cathode direction. Hence, the same type of organic material can be used to fabricate the channel of the thin film transistor and the organic light-emitting layer of the organic light-emitting diode.

In addition, the organic thin film transistor is used as an active device in the organic light-emitting diode in this invention. Because the organic thin film transistor is easier to fabricate compared with a conventional inorganic transistor and the same type of organic material is used to fabricate the channel of the thin film transistor and the organic light-emitting layer of the organic light-emitting diode, the active matrix organic light-emitting diode is easier and cheaper to produce.

Furthermore, with the organic thin film transistor serving as the active device of an organic light-emitting diode, the required processing temperature is lower and the organic layer has greater plasticity. Therefore, aside from being fabricated on a glass substrate, the organic light-emitting diode of this invention can also be fabricated on a plastic substrate (a soft substrate). In other words, the fabricating method has a wider range of applications.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
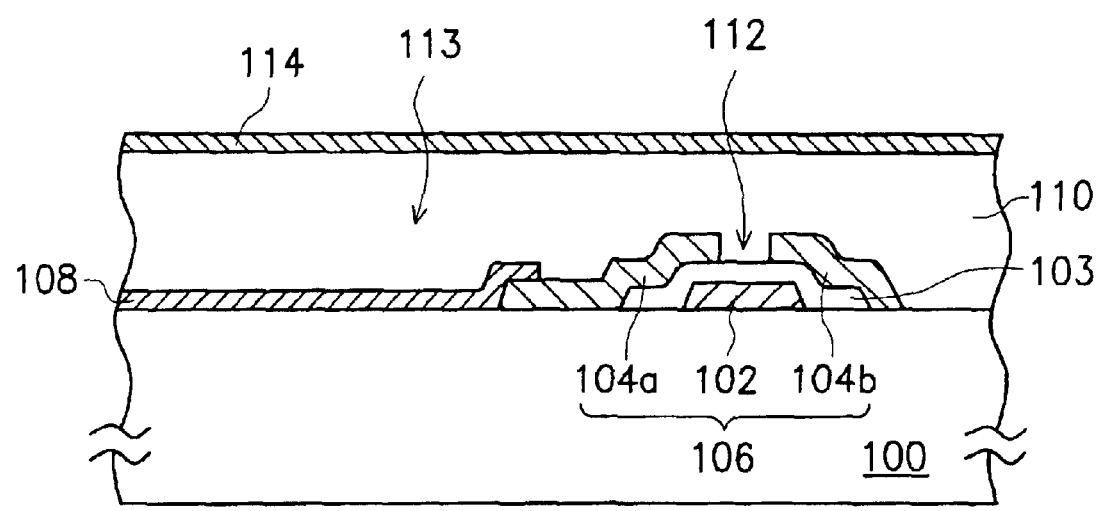
FIG. 1 is a schematic cross-sectional view of an organic light-emitting diode according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of an organic light-emitting diode according to one preferred embodiment of this invention. To fabricate an active organic light-emitting diode, a substrate 100 such as a glass substrate or a plastic substrate is provided. Thereafter, a thin film transistor 106 is formed over the substrate 100. The thin film transistor 106 comprises a gate 102, a source 104a and a drain 104b.

In one embodiment of this invention, the thin film transistor 106 is formed in a few steps. First, a gate 102 and a scan line (not shown) having an electrical connection with the gate 102 are formed on a substrate. Afterwards, a gate dielectric layer 103 is formed over the substrate 100 globally to cover the gate 102 and the scan line. Next, a source 104a, a drain 104b and a data line (not shown) having an electrical connection with the drain 104b are formed on the gate dielectric layer 103. In the aforementioned process, the gate dielectric layer 103 may be patterned to retain only the gate dielectric material between the gate 102 and the source/drain 104a/104b. Alternatively, no patterning is carried out so that the gate dielectric layer 103 covers the entire substrate 100 surface.

After forming the thin film transistor 106, an anode layer 108 is formed over the substrate 100. The anode layer 108 and the source terminal 104a of the thin film transistor 106 are electrically connected. The anode layer 108 can be fabricated using a transparent conductive material or a non-transparent conductive material. In the preferred embodiment of this invention, the anode layer 108 is fabricated using a transparent conductive material including, for example, indium-tin oxide (ITO) or indium-zinc oxide (IZO).

Thereafter, an organic layer 110 is formed over the substrate 100 to cover the thin film transistor 106 and the anode layer 108. The organic layer 110 is a light-emitting organic semiconductor material layer such that the organic layer 100 between the source 104a and the drain 104b serves as a channel region 112 for the thin film transistor 106. Finally, a cathode layer 114 is formed over the organic layer 110 to produce an active organic light-emitting diode. The organic layer 110 between the anode layer 108 and the cathode layer 114 is a light-emitting region 113. The cathode layer 114 can be fabricated using a transparent conductive material or a non-transparent conductive material. In one preferred embodiment of this invention, the cathode layer 114 is a metallic material layer including, for example, a cathode layer composed of a calcium layer and an aluminum layer.

Figure 2:
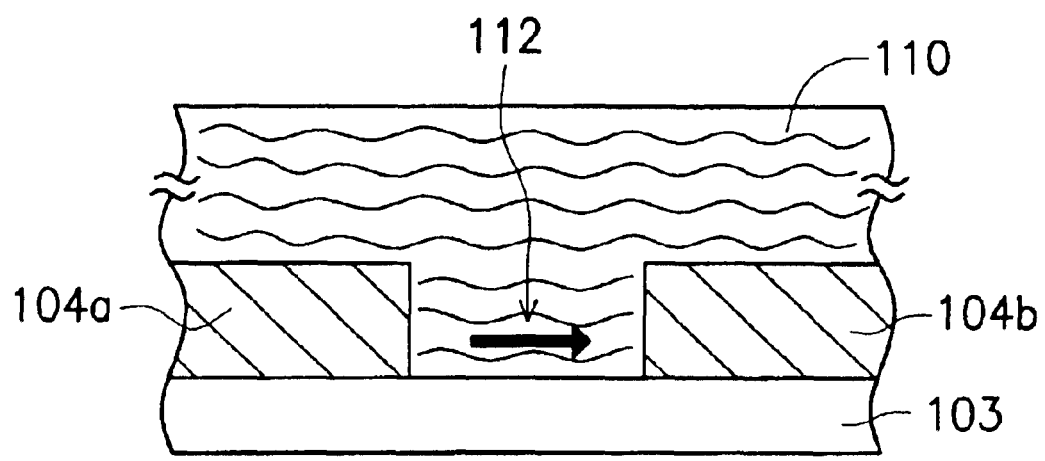
FIG. 2 is a magnified view of the organic thin film transistor in FIG. 1.
Figure 3:
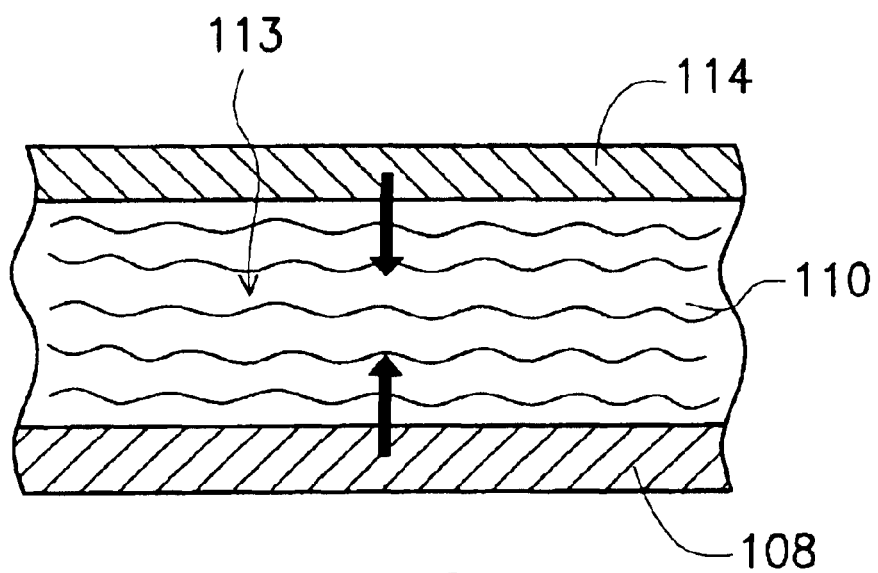
FIG. 3 is a magnified view of the light-emitting region of the organic light-emitting diode in FIG. 1.

In particular, the aforementioned organic layer 110 is made from an organic polymeric compound having a long chain molecular structure. The polymeric molecular chains are often aligned along an axis parallel to the source-to-drain (a direction from the source 104a to the drain 104b) direction. With this molecular alignment, electron mobility in the direction from the source 104a to the drain 104b is enhanced as shown in FIG. 2. In addition, the alignment of the polymeric molecular chains is also perpendicular to the anode-to-cathode (a direction from the cathode layer 114 to the anode layer 108) direction. With this molecular alignment, the electron/hole mobility from the anode layer 108 to the cathode layer 114 (cathode layer 114 to anode layer 108) is reduced so that the light-emitting capacity is increased as shown in FIG. 3. To align the long molecular chains within the organic layer 110 in a proper direction, a spin-coating process is preformed.

In general, the channel of most thin film transistors must be fabricated using a material having high electron mobility. On the contrary, the organic light-emitting layer in an organic light-emitting device must be fabricated using a material having low electron mobility to increase the light emission rate. With such opposing requirements, it is almost impossible to fabricate both the channel of the thin film transistor and the organic light-emitting layer of the organic light-emitting device using an identical organic material.

In this invention, one type of organic material can be used to fabricate both the channel of a thin film transistor and the organic light-emitting layer of the organic light-emitting diode. The molecules within the organic layer 110 are aligned along an axis parallel to the source-to-drain direction and yet perpendicular to the anode-to-cathode direction. With respect to the channel region 112 of the thin film transistor 106, the molecules within the organic layer 110 are aligned in a direction from the source 104a to the drain 104b. Hence, the channel region 112 (a horizontal direction) has a high electron mobility. On the other hand, with respect to the light-emitting region 113 of the organic light-emitting diode, the molecules within the organic layer 110 are aligned in a direction perpendicular to a direction from the anode layer 108 to the cathode layer 114. Hence, the light-emitting region 113 (a vertical direction) has a low electron mobility.

Since both the channel region 112 of the thin film transistor 106 and the light-emitting region 113 of the organic light-emitting diode are fabricated in a single step of forming the organic layer 110, the processing requirement in this invention is greatly simplified.

The active organic light-emitting diode fabricated using the method of this invention comprises a thin film transistor 106, an anode layer 108, an organic layer 110 and a cathode layer 114. The thin film transistor 106 is positioned over a substrate 100. The thin film transistor furthermore comprises a gate 102, a source 104a and a drain 104b. The anode layer 108 is positioned over the substrate 100 such that the anode layer 108 and the source terminal 104a of the thin film transistor 106 are electrically connected. The organic layer 110 is also positioned over the substrate 100 to cover the thin film transistor 106 and the anode layer 108. In addition, the cathode layer 114 is positioned over the organic layer 110 to constitute the active organic light-emitting diode.

The organic layer 110 is fabricated using a light-emitting organic semiconductor material. The organic layer 110 between the source 104a and the drain 104b serves as the channel region 112 for the thin film transistor 106 and the organic layer 110 between the anode layer 108 and the cathode layer 114 serves as the light-emitting region 113 of the organic light-emitting diode. Furthermore, the organic layer 110 is fabricated using an organic polymer compound with long molecular chains. The molecular chains are aligned along an axis parallel to the source 104a to the drain 104b direction but perpendicular to the anode layer 108 to the cathode layer 114 direction.

In this invention, the molecular chains within the organic layer are aligned along an axis parallel to the source-to-drain direction but perpendicular to the anode-to-cathode direction. Hence, the same type of organic material can be used to fabricate the channel of the thin film transistor and the organic light-emitting layer of the organic light-emitting diode.

In addition, the organic thin film transistor is used as an active device in the organic light-emitting diode in this invention. Because the organic thin film transistor is easier to fabricate compared with a conventional inorganic transistor and the same type of organic material is used to fabricate the channel of the thin film transistor and the organic light-emitting layer of the organic light-emitting diode, the active matrix organic light-emitting diode is easier and cheaper to produce.

Furthermore, with the organic thin film transistor serving as the active device of an organic light-emitting diode, the required processing temperature is lower and the organic layer has greater plasticity. Therefore, aside from fabricating on a glass substrate, the organic light-emitting diode of this invention can also be fabricated on a plastic substrate so that the fabricating method has a wide range of applications.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active organic light-emitting diode, comprising:
   a thin film transistor formed over a substrate, wherein the thin film transistor has a gate, a drain and a source;
   an anode layer formed over the substrate, wherein the anode layer and the source terminal of the thin film transistor are electrically connected;
   an organic layer formed over the substrate to cover the thin film transistor and the anode layer, wherein the organic layer is fabricated using a light-emitting organic semiconductor material such that the organic layer between the source and the drain serves also as a channel region of the thin film transistor, and furthermore, both the organic layer covering the anode layer as well as the organic layer serving as the channel region are fabricated using an identical organic material; and
   a cathode layer formed over the organic layer, wherein the organic layer between the anode layer and the cathode layer constitutes a light-emitting region.

2. The organic light-emitting diode of claim 1, wherein the organic layer is fabricated from an organic polymeric compound containing long molecular chains that align along an axis parallel to the source-to-drain direction.

3. The organic light-emitting diode of claim 2, wherein the long molecular chains inside the organic polymeric compound are aligned along an axis perpendicular to the anode-to-cathode direction.

4. The organic light-emitting diode of claim 1, wherein the substrate comprises a glass substrate.

5. The organic light-emitting diode of claim 1, wherein the substrate comprises a plastic substrate.

6. A method of fabricating an active organic light-emitting diode, comprising the steps of:
   providing a substrate;
   forming a thin film transistor over the substrate, wherein the thin film transistor has a gate, a source and a drain;
   forming an anode layer over the substrate, wherein the anode layer and the source terminal of the thin film transistor are electrically connected;
   forming an organic layer over the substrate globally to cover the anode layer and the thin film transistor, wherein the organic layer is fabricated using a light-emitting organic semiconductor material such that the organic layer between the source and the drain constitutes a channel region of the thin film transistor; and
   forming a cathode layer over the organic layer, wherein the organic layer between the anode layer and the cathode layer constitutes a light-emitting region.

7. The method of claim 6, wherein the organic layer is fabricated from an organic polymeric compound containing long molecular chains that align along an axis parallel to the source-to-drain direction.

8. The method of claim 7, wherein the long molecular chains inside the organic polymeric compound are aligned along an axis perpendicular to the anode-to-cathode direction.

9. The method of claim 6, wherein the step of forming the organic layer comprises performing a spin-coating process.

10. The method of claim 6, wherein the substrate comprises a glass substrate.

11. The method of claim 6, wherein the substrate comprises a plastic substrate.

* * * * *